(12) United States Patent  (10) Patent No.: US 8,648,349 B2
Masuda et al.  (45) Date of Patent: Feb. 11, 2014

(54) SEMICONDUCTOR DEVICE

(75) Inventors: Takeyoshi Masuda, Osaka (JP); Misako Honaga, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 52 days.

(21) Appl. No.: 13/121,122

(22) PCT Filed: May 12, 2010

(86) PCT No.: PCT/JP2010/058019
§ 371 (c)(1),
(2), (4) Date: Mar. 25, 2011

(87) PCT Pub. No.: WO2011/021413
PCT Pub. Date: Feb. 24, 2011

(65) Prior Publication Data
US 2011/0180812 A1 Jul. 28, 2011

(30) Foreign Application Priority Data

Aug. 18, 2009 (JP) ................................. 2009-189152

(51) Int. Cl.
*H01L 29/15* (2006.01)
(52) U.S. Cl.
USPC .. 257/76; 257/77; 257/E29.068; 257/E29.089
(58) Field of Classification Search
USPC ................... 257/77, 76, E29.068, E29.089
See application file for complete search history.

(56) References Cited

U.S. PATENT DOCUMENTS

| 6,346,727 B1 * | 2/2002 | Ohtomo ........................ 257/341 |
| 6,452,222 B1 | 9/2002 | Itoh |
| 6,724,044 B2 * | 4/2004 | Blanchard ..................... 257/341 |
| 2003/0020136 A1 * | 1/2003 | Kitabatake et al. ........... 257/502 |
| 2007/0132012 A1 * | 6/2007 | Saito ............................. 257/327 |

FOREIGN PATENT DOCUMENTS

| CN | 1395746 A | 2/2003 |
| JP | 61-080859 A | 4/1986 |
| JP | 02-102580 A | 4/1990 |
| JP | 02-178975 A | 7/1990 |
| JP | 11-204781 A | 7/1999 |
| JP | 2000-077662 A | 3/2000 |
| WO | WO-02/43157 A1 | 5/2002 |

OTHER PUBLICATIONS

Office Action in Chinese Patent Application No. 201080002761.0 dated Dec. 10, 2012.

* cited by examiner

*Primary Examiner* — Nikolay Yushin
(74) *Attorney, Agent, or Firm* — Venable LLP; Michael A. Sartori; Tamatane J. Aga

(57) ABSTRACT

A MOSFET which is a semiconductor device capable of achieving a stable reverse breakdown voltage and reduced on-resistance includes a SiC wafer of an n conductivity type, a plurality of p bodies of a p conductivity type formed to include a first main surface of the SiC wafer, and n⁺ source regions of the n conductivity type formed in regions surrounded by the plurality of p bodies, respectively, when viewed two-dimensionally. Each of the p bodies has a circular shape when viewed two-dimensionally, and each of the n⁺ source regions is arranged concentrically with each of the p bodies and has a circular shape when viewed two-dimensionally. Each of the plurality of p bodies is arranged to be positioned at a vertex of a regular hexagon when viewed two-dimensionally.

4 Claims, 16 Drawing Sheets

SEMICONDUCTOR DEVICE

TECHNICAL FIELD

The present invention relates to semiconductor devices, and more particularly to a semiconductor device capable of achieving a stable reverse breakdown voltage and reduced on-resistance.

BACKGROUND ART

In recent years, further improved reliability and loss reduction have been required of devices including a semiconductor device such as a power device. With this trend, power devices such as a MOSFET (Metal Oxide Semiconductor Field Effect Transistor), a JFET (Junction Field Effect Transistor), and an IGBT (Insulated Gate Bipolar Transistor) have been required to have a higher reverse breakdown voltage and reduced on-resistance.

To meet these requirements, an ACCUFET (Accumulation Mode FET) has been proposed in which a plane shape of a cell (i.e., plane shapes of a body region, a carrier supply region surrounded by this body region when viewed two-dimensionally, and the like) is hexagonal, with each cell being arranged to be positioned at a vertex of the hexagon. With such arrangement, a reverse breakdown voltage can be improved (see WO02/43157 (Patent Document 1), for example).

PRIOR ART DOCUMENTS

Patent Documents

Patent Document 1: WO02/43157

SUMMARY OF THE INVENTION

Problems to be Solved by the Invention

When a cell having a hexagonal plane shape is employed, however, it is difficult to maintain a design shape of the cell during a manufacturing process of a semiconductor device. In particular, a difference from the design shape becomes larger near vertices of the hexagon as the manufacturing process proceeds. When a cell having a hexagonal plane shape is employed, therefore, a difference may arise between a design reverse breakdown voltage and an actual reverse breakdown voltage, resulting in failure to obtain a stable reverse breakdown voltage.

The body region surrounding the carrier supply region when viewed two-dimensionally functions as a channel region. When a hexagonal cell is employed, this channel region has a thickness that varies between a direction toward a side of the body region and a direction toward a vertex when viewed from the carrier supply region, with the thickness being larger in the direction toward the vertex. As a result, a channel length becomes longer and resistance increases in this direction, resulting in formation of an ineffective channel region, which causes increase in on-resistance.

The present invention was made to solve these problems, and an object of the present invention is to provide a semiconductor device capable of achieving a stable reverse breakdown voltage and reduced on-resistance.

Means for Solving the Problems

A semiconductor device according to one aspect of the present invention includes a semiconductor wafer of a first conductivity type, a plurality of body regions of a second conductivity type formed to include a first main surface which is one main surface of the semiconductor wafer, and carrier supply regions of the first conductivity type formed in regions surrounded by the plurality of body regions, respectively, when viewed two-dimensionally. Each of the body regions has a circular shape when viewed two-dimensionally. Each of the carrier supply regions is arranged concentrically with each of the body regions and has a circular shape when viewed two-dimensionally. Each of the plurality of body regions is arranged to be positioned at a vertex of a regular hexagon when viewed two-dimensionally.

In the semiconductor device according to the one aspect of the present invention, plane shapes of the body region and the carrier supply region are concentric circular shapes. That is, in the semiconductor device according to the one aspect, a circular shape is employed as a plane shape of a cell. Accordingly, increase in difference from a design shape with progression of a manufacturing process which occurs such as when a conventional hexagonal cell is employed is suppressed, thereby stabilizing a reverse breakdown voltage.

Further, by employing a circular shape as a plane shape of a cell, a channel length becomes substantially the same in all directions. Accordingly, formation of an ineffective channel region which occurs such as when a conventional hexagonal cell is employed is suppressed, thereby substantially increasing a channel width. When a circular shape is employed as a plane shape of a cell, and each cell is arranged to be positioned at a vertex of a regular hexagon as in the semiconductor device according to the one aspect, a region sandwiched between adjacent body regions (between-body region) has a width that varies depending on a location. For this reason, in order to expand a depletion layer across the between-body region during reverse bias when the semiconductor device is designed with the same reverse breakdown voltage as when a cell having a conventional regular hexagonal shape is employed, a channel region needs to be increased. This results in increased resistance in the between-body region during forward bias. Nonetheless, because the channel width can be substantially increased as described above, resistance per unit area during forward bias, i.e., on-resistance, can be reduced as a whole.

As described above, according to the semiconductor device of the one aspect of the present invention, a semiconductor device capable of achieving a stable reverse breakdown voltage and reduced on-resistance can be provided.

In the semiconductor device according to the one aspect, the body region and the carrier supply region need to have a "circular shape" as described above. While this "circular shape" is most preferably a true circular shape in terms of obtaining the function and effect stated above, the function and effect stated above can be sufficiently obtained with a substantially circular shape. More specifically, assuming that a radius of a circle having a minimum radius including the body region (or the carrier supply region) when viewed two-dimensionally is R, and a radius of a circle having a maximum radius that can be drawn in the body region (or the carrier supply region) is r, the function and effect stated above can be sufficiently obtained if r/R is not less than 0.9. In the present application, the "circular shape" as the plane shapes of the body region and the carrier supply region means that r/R mentioned above is not less than 0.9. This r/R is preferably not less than 0.92, more preferably not less than 0.98, and most preferably 1.

A semiconductor device according to another aspect of the present invention includes a semiconductor wafer of a first conductivity type, a plurality of body regions of a second conductivity type formed to include a first main surface which is one main surface of the semiconductor wafer, and carrier supply regions of the first conductivity type formed in regions surrounded by the plurality of body regions, respectively, when viewed two-dimensionally. Each of the body regions has a regular polygonal shape with seven or more vertices when viewed two-dimensionally. Each of the carrier supply regions is arranged such that its centroid coincides with a centroid of each of the body regions and has a homothetic shape to each of the body regions when viewed two-dimensionally. Each of the plurality of body regions is arranged to be positioned at a vertex of a regular hexagon when viewed two-dimensionally.

In the semiconductor device according to the another aspect of the present invention, plane shapes of the body region and the carrier supply region are regular polygonal shapes with seven or more vertices and coinciding centroids. That is, in the semiconductor device according to the another aspect, a regular polygonal shape with seven or more vertices is employed as a plane shape of a cell. This leads to a larger angle formed by the sides than when a conventional hexagonal cell is employed. Accordingly, increase in difference from a design shape with progression of a manufacturing process is suppressed, thereby stabilizing a reverse breakdown voltage.

Further, by employing a regular polygonal shape with seven or more vertices, i.e., a more circular shape than the conventional shape, as a plane shape of a cell, variation in channel length depending on a direction is made smaller. Accordingly, formation of an ineffective channel region which occurs such as when a conventional hexagonal cell is employed is suppressed, thereby substantially increasing a channel width. When a regular polygonal shape with seven or more vertices is employed as a plane shape of a cell, a channel region needs to be increased as when a circular shape is employed in the semiconductor device according to the one aspect. Nonetheless, because the channel width can be substantially increased, resistance per unit area during forward bias, i.e., on-resistance, can be reduced as a whole.

As described above, according to the semiconductor device of the another aspect of the present invention, a semiconductor device capable of achieving a stable reverse breakdown voltage and reduced on-resistance can be provided.

In the semiconductor device according to the another aspect, the "regular polygon" preferably has eight or more vertices, and more preferably has twenty or more vertices. As the plane shape of a cell becomes more like a circle in this manner, a more stable reverse breakdown voltage and reduced on-resistance can be achieved.

As described above, in the semiconductor device according to the another aspect, the body region and the carrier supply region need to have a "regular polygonal shape." This "regular polygonal shape" does not need to have sides completely linear until end portions, but may be rounded near each vertex. More specifically, a region within 5% from vertices which are both ends of each side with respect to a length of the side may be curvilinear to have a convex shape toward a side away from the centroid.

In the above semiconductor device, the above semiconductor wafer may be made of a wide band gap semiconductor. When a wide band gap semiconductor such as SiC (silicon carbide) is employed as a material for a semiconductor wafer forming a MOSFET which is a semiconductor device, a ratio of channel resistance to total resistance in the MOSFET is increased, and a ratio of resistance in the between-body region is reduced. Accordingly, in the semiconductor device of the present invention capable of achieving reduced channel resistance, it is preferable to employ a wide band gap semiconductor as a material for the semiconductor wafer. The wide band gap semiconductor means a semiconductor having a band gap wider than that of Si (silicon), and examples thereof include SiC, GaN (gallium nitride), and the like.

Effects of the Invention

As is clear from the description above, according to the semiconductor device of the present invention, a semiconductor device capable of achieving a stable reverse breakdown voltage and reduced on-resistance can be provided.

MODES FOR CARRYING OUT THE INVENTION

Figure 1:
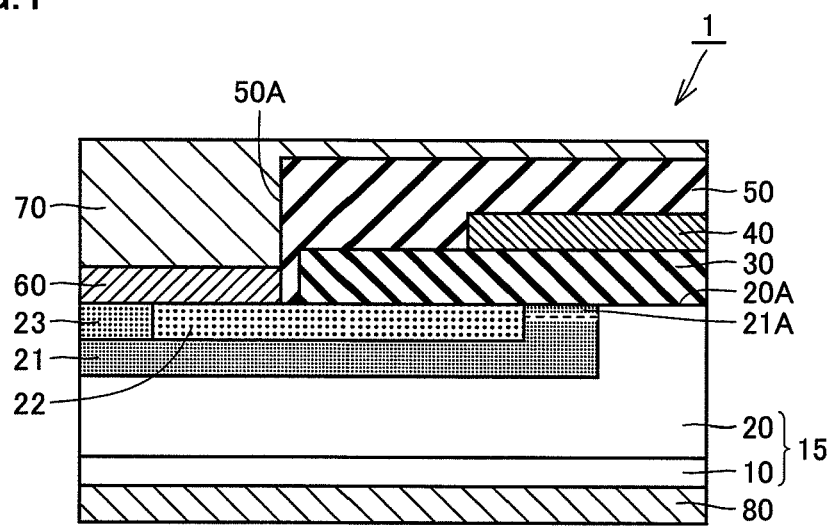
FIG. 1 is a schematic cross-sectional view showing a structure of a MOSFET.

Embodiments of the present invention will be described hereinafter with reference to the drawings. It is noted that the same or corresponding parts have the same reference numerals allotted in the drawings, and description thereof will not be repeated.

(First Embodiment)

Figure 2:
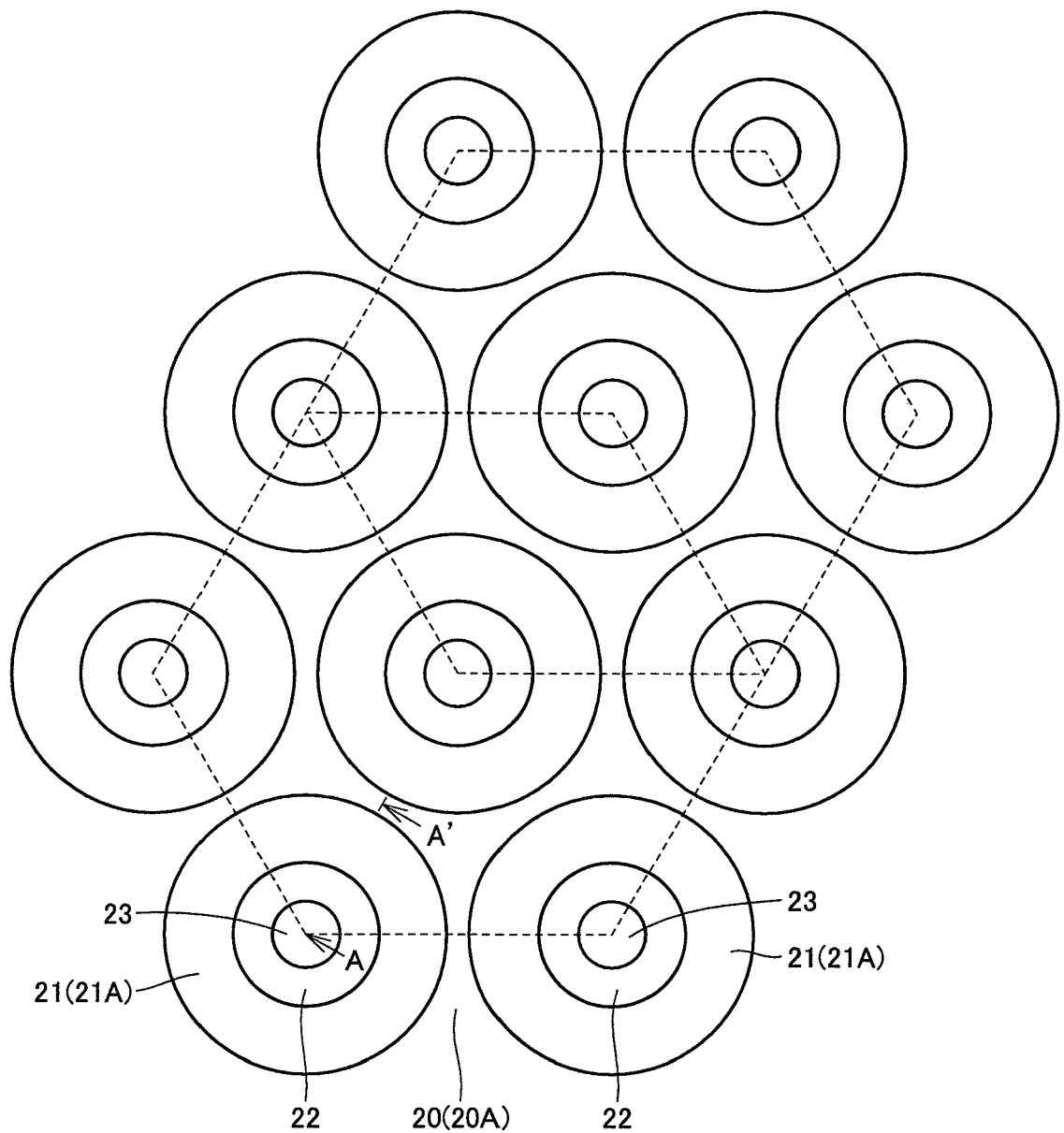
FIG. 2 is a schematic plan view showing a cell structure of the MOSFET.
Figure 3:
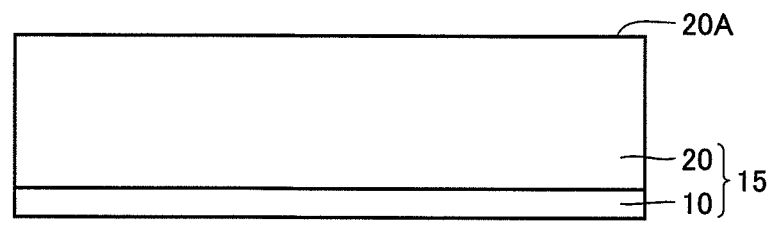
FIG. 3 is a schematic cross-sectional view for illustrating a manufacturing step of the MOSFET.
Figure 4:
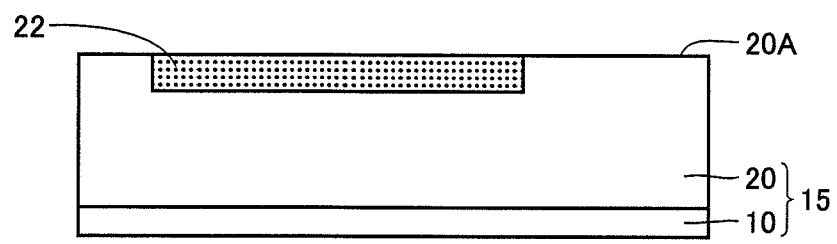
FIG. 4 is a schematic cross-sectional view for illustrating a manufacturing step of the MOSFET.

Referring to FIGS. 1 and 2, a first embodiment which is one embodiment of the present invention is described hereinafter. FIG. 1 is a cross-sectional view taken along line A-A' in FIG. 2. FIG. 2 is a plan view of a first main surface 20A in FIG. 1 viewed from above.

Referring to FIG. 1, a MOSFET 1 which is a semiconductor device in the first embodiment includes an $n^+$ SiC substrate 10 made of SiC which is a wide band gap semiconductor as a substrate of an n conductivity type (first conductivity type), an $n^-$ SiC layer 20 as a semiconductor layer of the n conductivity type (first conductivity type), a p body 21 as a body region of a p conductivity type (second conductivity type), an $n^+$ source region 22 as a carrier supply region of the n conductivity type (first conductivity type), and a $p^+$ region 23 as a high concentration second conductivity type region of the p conductivity type (second conductivity type). $N^+$ SiC substrate 10 and $n^-$ SiC layer 20 form a SiC wafer 15 which is a semiconductor wafer of the n conductivity type.

$N^+$ SiC substrate 10 is made of hexagonal SiC, for example, and includes an n type impurity (impurity of the n conductivity type) of high concentration. $N^-$ SiC layer 20 is formed on one main surface of $n^+$ SiC substrate 10, and has the n conductivity type by including an n type impurity. The n type impurity included in $n^-$ SiC layer 20 is N (nitrogen), for example, and is included in lower concentration than the n type impurity included in $n^+$ SiC substrate 10.

P body 21 is formed in $n^-$ SiC layer 20 to include first main surface 20A opposite to a main surface on which $n^+$ SiC substrate 10 is formed, and has the p conductivity type (second conductivity type) by including a p type impurity (impurity of the p conductivity type). The p type impurity included in p body 21 is aluminum (Al), boron (B), for example, and is included in lower concentration than the n type impurity included in $n^+$ SiC substrate 10. Referring to FIG. 2, a plurality of p bodies 21 are formed, each of which has a circular shape when viewed two-dimensionally. In addition, each of p bodies 21 is arranged to be positioned at a vertex of a regular hexagon when viewed two-dimensionally.

$N^+$ source region 22 is formed within p body 21 to include first main surface 20A and to be surrounded by p body 21. $N^+$ source region 22 includes an n type impurity such as P, As in higher concentration than the n type impurity included in $n^-$ SiC layer 20. In addition, $n^+$ source region 22 is arranged concentrically with p body 21 and has a circular shape when viewed two-dimensionally, and each of $n^+$ source regions 22 is arranged to be positioned at a vertex of a regular hexagon in a manner similar to p body 21.

$P^+$ region 23 is formed within $n^+$ source region 22 to include first main surface 20A. $P^+$ region 23 includes a p type impurity such as Al, B in higher concentration than the p type impurity included in p body 21. In addition, $p^+$ region 23 is arranged concentrically with $n^+$ source region 22 and has a circular shape when viewed two-dimensionally, and each of $p^+$ regions 23 is arranged to be positioned at a vertex of a regular hexagon in a manner similar to p body 21 and $n^+$ source region 22.

Referring to FIG. 1, MOSFET 1 further includes a gate oxide film 30 as an insulating film, a gate electrode 40, an interlayer insulating film 50, a source ohmic electrode 60, a source line 70, and a drain ohmic electrode 80.

Gate oxide film 30 is formed in contact with first main surface 20A to extend from a region covering a surface of $n^+$ source region 22 to a region covering a surface of p body 21 (region where $n^+$ source region 22 is not formed) and a region covering a surface of $n^-$ SiC layer 20 (region where p body 21 is not formed). Gate oxide film 30 is made of silicon dioxide ($SiO_2$), for example.

Gate electrode 40 is formed in contact with gate oxide film 30 to extend from the region covering the surface of $n^+$ source region 22 to the region covering the surface of p body 21 (region where $n^+$ source region 22 is not formed) and the region covering the surface of $n^-$ SiC layer 20 (region where p body 21 is not formed). Gate electrode 40 is made of a conductor such as polysilicon, Al.

Source ohmic electrode 60 is formed on first main surface 20A in contact with $n^+$ source region 22 and $p^+$ region 23. Source ohmic electrode 60 is made of a material such as NiSi (nickel silicide), which is capable of establishing ohmic contact with $n^+$ source region 22 and $p^+$ region 23.

Source line 70 is formed on and in contact with source ohmic electrode 60 on first main surface 20A. Source line 70 is made of a conductor such as Al.

Drain ohmic electrode 80 is formed in contact with a main surface of $n^+$ SiC substrate 10 opposite to the main surface on which $n^-$ SiC layer 20 is formed. Drain ohmic electrode 80 is made of a material such as NiSi, which is capable of establishing ohmic contact with $n^+$ SiC substrate 10, and is electrically connected to $n^+$ SiC substrate 10.

Interlayer insulating film 50 is disposed on gate oxide film 30 to surround gate electrode 40. Interlayer insulating film 50 is made of an insulator such as $SiO_2$. Thus, gate electrode 40 and source line 70 are isolated from each other.

That is, MOSFET 1 as a semiconductor device in the first embodiment includes SiC wafer 15 of the n conductivity type, the plurality of p bodies 21 of the p conductivity type formed to include first main surface 20A of SiC wafer 15, and $n^+$ source regions 22 of the n conductivity type formed in regions surrounded by the plurality of p bodies 21, respectively, when viewed two-dimensionally. P body 21 has a circular shape when viewed two-dimensionally, and $n^+$ source region 22 is arranged concentrically with p body 21 and has a circular shape when viewed two-dimensionally. Additionally, each of the plurality of p bodies 21 is arranged to be positioned at a vertex of a regular hexagon when viewed two-dimensionally.

Operation of MOSFET 1 is described next. Referring to FIG. 1, when gate electrode 40 has a voltage of not more than a threshold value, i.e., in an off state, p body 21 located immediately below gate oxide film 30 and $n^-$ SiC layer 20 are reverse biased, to enter a non-conducting state. As a positive voltage is applied to gate electrode 40, an inversion layer is formed in a channel region 21A near a portion in contact with gate oxide film 30 in p body 21. As a result, $n^+$ source region 22 and $n^-$ SiC layer 20 are electrically connected to each other, causing a current to flow between source line 70 and drain ohmic electrode 80.

Figure 5:
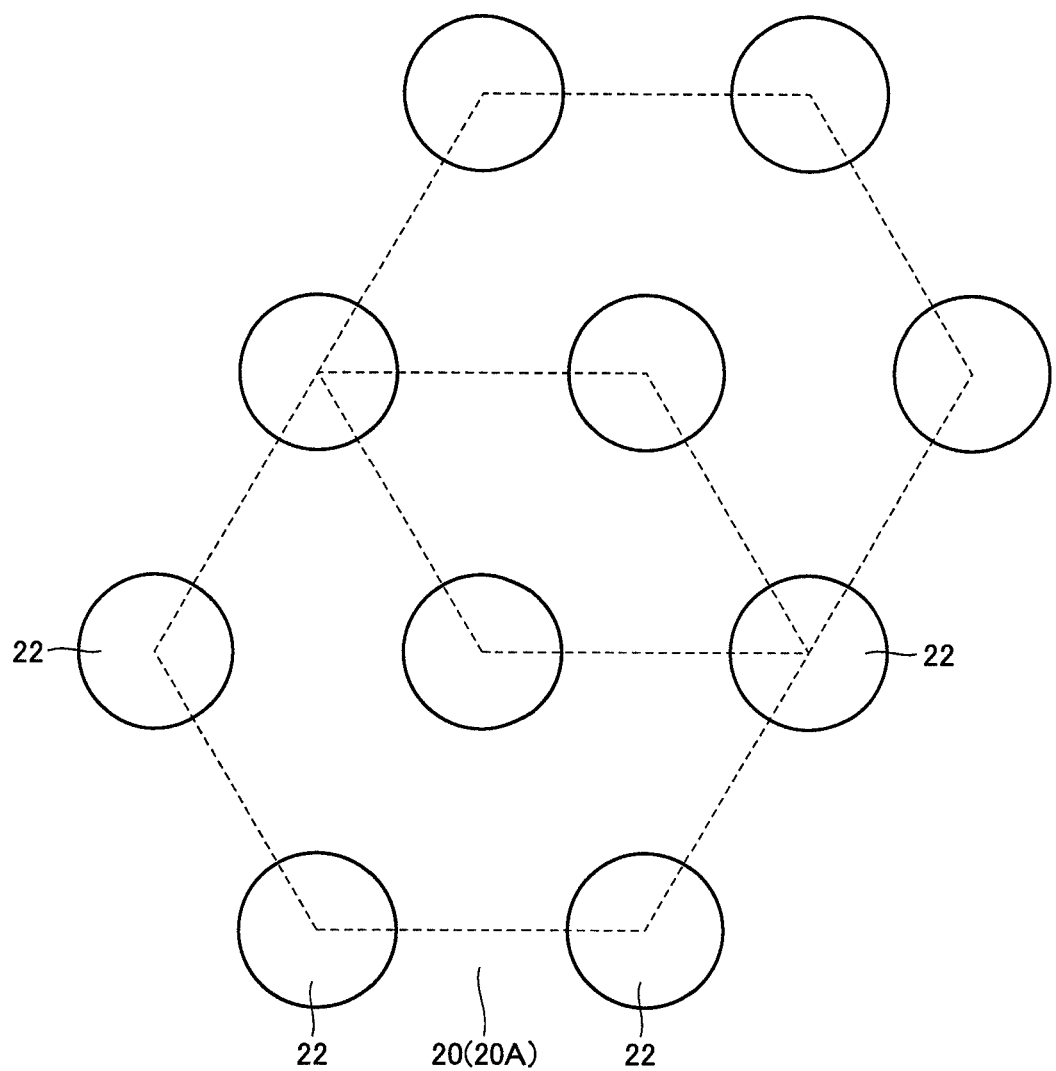
FIG. 5 is a schematic plan view for illustrating a manufacturing step of the MOSFET.
Figure 6:
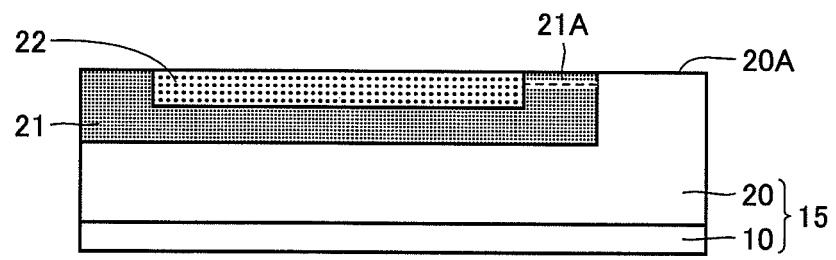
FIG. 6 is a schematic cross-sectional view for illustrating a manufacturing step of the MOSFET.
Figure 7:
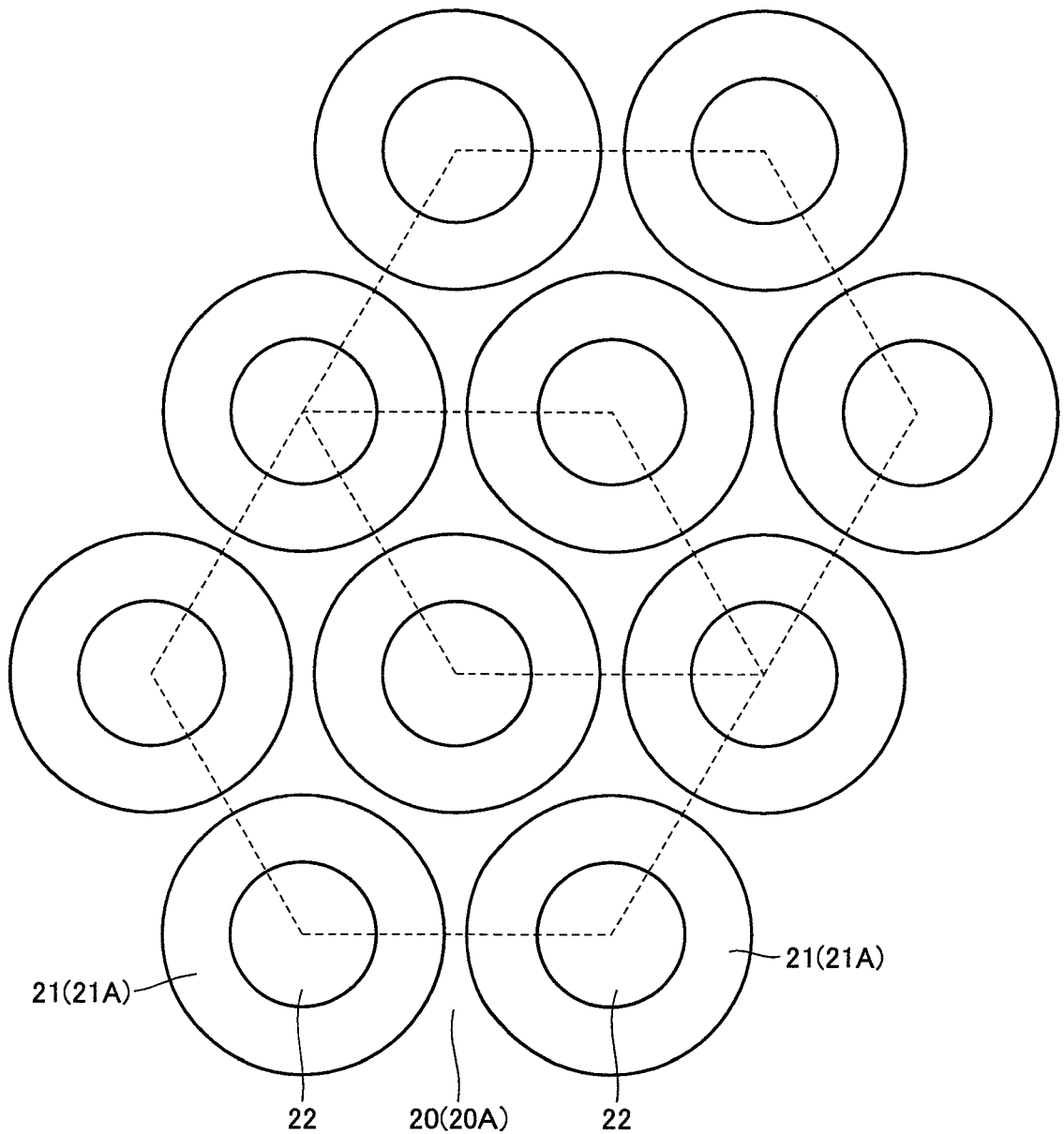
FIG. 7 is a schematic plan view for illustrating a manufacturing step of the MOSFET.
Figure 8:
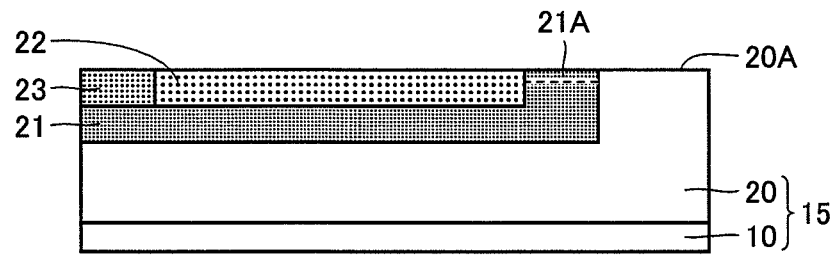
FIG. 8 is a schematic cross-sectional view for illustrating a manufacturing step of the MOSFET.
Figure 9:
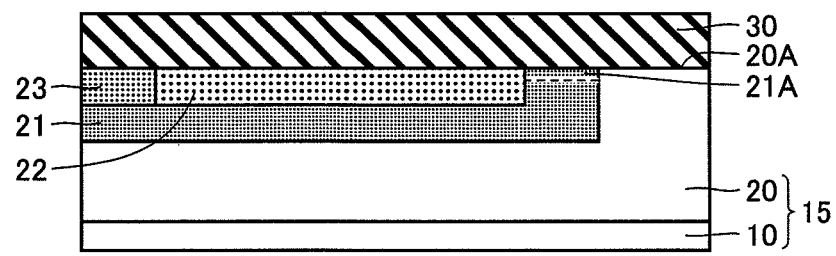
FIG. 9 is a schematic cross-sectional view for illustrating a manufacturing step of the MOSFET.
Figure 10:
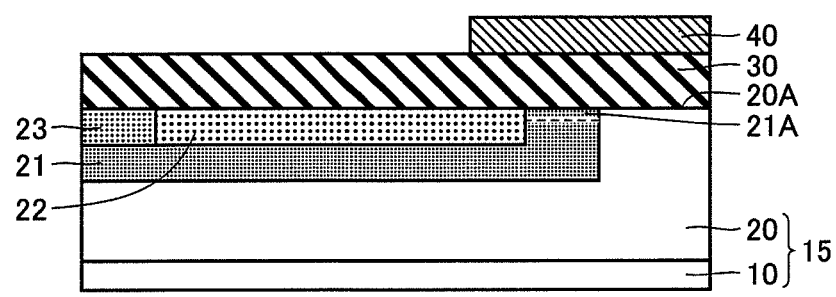
FIG. 10 is a schematic cross-sectional view for illustrating a manufacturing step of the MOSFET.

Referring now to FIGS. 1 to 14, a method of manufacturing MOSFET 1 in the first embodiment is described. FIGS. 3, 4, 6, and 8 to 14 are cross-sectional views corresponding to the cross section in FIG. 1. FIGS. 5 and 7 are plan views of first main surface 20A viewed from above, in a manner similar to the case in FIG. 2.

In the method of manufacturing MOSFET 1 of the present embodiment, first, a step of preparing a substrate is performed. Specifically, referring to FIG. 3, $n^+$ SiC substrate 10 which is made of hexagonal SiC, for example, and has the n conductivity type by including the n type impurity is prepared.

Next, a step of forming $n^-$ SiC layer 20 is performed. Specifically, referring to FIG. 3, $n^-$ SiC layer 20 is formed on $n^+$ SiC substrate 10 by epitaxial growth. The epitaxial growth can be carried out by employing mixed gas of $SiH_4$ (silane) and $C_3H_8$ (propane) as a source gas, for example. Here, nitrogen is introduced as the n type impurity, for example. Consequently, $n^-$ SiC layer 20 including the n type impurity in lower concentration than the n type impurity included in $n^+$ SiC substrate 10 can be formed.

Next, a step of forming $n^+$ source region 22 is performed. Specifically, referring to FIGS. 3 to 5, first, an oxide film made of $SiO_2$ is formed on first main surface 20A by CVD (Chemical Vapor Deposition), for example. Then, a resist is applied to the oxide film, followed by exposure and development, to form a resist film having an opening in a region corresponding to arrangement and a shape of desired $n^+$ source region 22. Then, the oxide film is partially removed by RIE (Reactive Ion Etching), for example, with this resist film as a mask, to form a mask layer formed of the oxide film having an opening pattern on $n^-$ SiC layer 20. The resist film is removed thereafter, and then ions are implanted into $n^-$ SiC layer 20 with this mask layer as a mask, to form $n^+$ source region 22 having a circular shape in if SiC layer 20 such that $n^+$ source region 22 is positioned at each vertex of a regular hexagon when viewed two-dimensionally (see FIG. 5). For the ion implantation, P may be employed as an n type impurity, for example.

Next, a step of forming p body 21 is performed. P body 21 can be formed by a self-align process as described below. Specifically, first, the mask layer formed of the oxide film that was used for forming $n^+$ source region 22 is subjected to isotropic etching, to isotropically enlarge the opening of the mask layer. Then, ions are implanted into $n^-$ SiC layer 20 with this mask layer as a mask, to form p body 21 surrounding $n^+$ source region 22 as shown in FIGS. 6 and 7. For the ion implantation, Al may be employed as a p type impurity, for example.

Next, a step of forming $p^+$ region 23 is performed. In this step, first, the mask layer that was used for forming p body 21 is removed. Then, in a manner similar to the formation of $n^+$ source region 22, a mask layer formed of an oxide film having an opening pattern corresponding to arrangement and a shape of $p^+$ region 23 is formed, and ions are implanted into $n^-$ SiC layer 20 with this mask layer as a mask. Consequently, $p^+$ region 23 having a circular shape when viewed two-dimensionally is formed in a region surrounded by $n^+$ source region 22. For the ion implantation, Al may be employed as a p type impurity, for example.

Next, an activation annealing step is performed. Specifically, $n^-$ SiC layer 20 into which the ions were implanted in the above process is heated, to activate the introduced impurity.

Next, a step of forming gate oxide film 30 is performed. In this step, referring to FIGS. 8 and 9, $n^-$ SiC layer 20 in which an ion-implanted region was formed in the above step is thermally oxidized. Consequently, gate oxide film 30 made of silicon dioxide ($SiO_2$) is formed to cover first main surface 20A.

Next, a step of forming gate electrode 40 is performed. In this step, referring to FIGS. 9 and 10, first, a resist film having an opening corresponding to a shape of desired gate electrode 40 is formed above first main surface 20A. Then, a polysilicon film is formed by CVD, for example, above first main surface 20A above which the resist film was formed. The polysilicon film on the resist film is then removed along with the resist film (lift-off), to form gate electrode 40.

Figure 11:
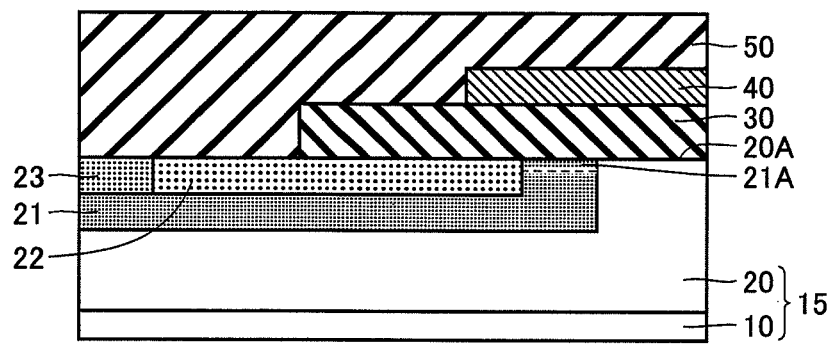
FIG. 11 is a schematic cross-sectional view for illustrating a manufacturing step of the MOSFET.
Figure 12:
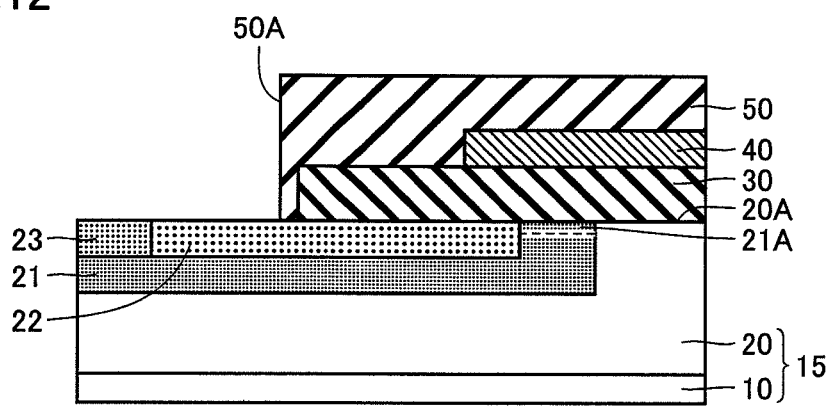
FIG. 12 is a schematic cross-sectional view for illustrating a manufacturing step of the MOSFET.
Figure 13:
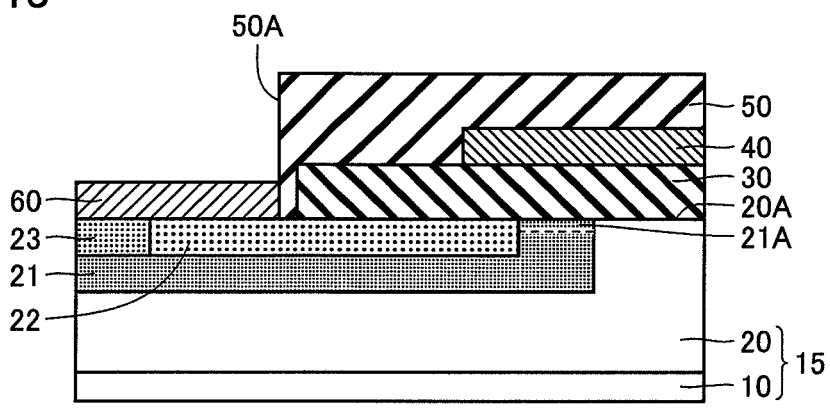
FIG. 13 is a schematic cross-sectional view for illustrating a manufacturing step of the MOSFET.
Figure 14:
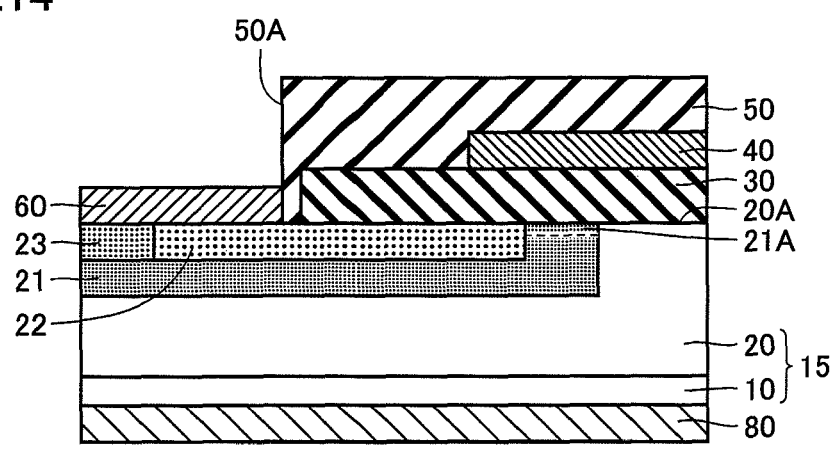
FIG. 14 is a schematic cross-sectional view for illustrating a manufacturing step of the MOSFET.

Next, a step of forming interlayer insulating film 50 is performed. In this step, first, interlayer insulating film 50 formed of a $SiO_2$ film is formed by CVD, for example, to cover first main surface 20A as shown in FIG. 11. Then, a resist film having an opening in a desired region is formed, for example, and RIE is performed with this resist film as a mask, to form a through hole in interlayer insulating film 50. Consequently, as shown in FIG. 12, a contact hole 50A passing through interlayer insulating film 50 in a thickness direction to expose $p^+$ region 23 and $n^+$ source region 22 is formed. With this process, interlayer insulating film 50 surrounding gate electrode 40 is completed.

Next, a step of forming source ohmic electrode 60 and drain ohmic electrode 80 is performed. Specifically, first, a Ni film is formed on first main surface 20A, with the resist film that was used for forming contact hole 50A being left. Then, the Ni film on the resist film is removed along with the resist film, to leave the Ni film in contact with $p^+$ region 23 and $n^+$ source region 22 exposed through contact hole 50A formed in interlayer insulating film 50. This Ni film is then heated and silicidized, to complete source ohmic electrode 60 made of NiSi (see FIG. 13). Further, a Ni film is formed on the main surface of $n^+$ SiC substrate 10 opposite to the main surface on which $n^-$ SiC layer 20 is formed, and this Ni film is then silicidized, to form drain ohmic electrode 80 made of NiSi (see FIG. 14). To simplify the manufacturing process, source ohmic electrode 60 and drain ohmic electrode 80 can be formed simultaneously.

Next, a step of forming source line 70 is performed. In this step, referring to FIGS. 14 and 1, an Al film is formed in contact with a surface of source ohmic electrode 60, for example, to form source line 70. With the process described above, MOSFET 1 in the first embodiment is completed.

When the mask layer used for forming p body 21 is prepared by performing isotropic etching on the mask layer that was used for forming $n^+$ source region 22 as described above, if p body 21 and $n^+$ source region 22 have a conventional hexagonal shape, then the opening of the mask used for forming p body 21 has a shape rounded near the vertices, which causes increase in difference between a shape of p body 21 actually formed and a design shape of p body 21 which should be a homothetic shape to $n^+$ source region 22. This results in difficulty in stabilizing a reverse breakdown voltage of an obtained MOSFET.

In contrast, since a circular shape is employed as a plane shape of a cell in MOSFET 1 above, the plane shapes of p body 21 and $n^+$ source region 22 are concentric circular shapes. Accordingly, even if the self-align process is employed to form p body 21 as described above, for example, the shape of the opening of the mask in forming p body 21 and the shape of the opening of the mask in forming $n^+$ source region 22 can be readily maintained to be substantially homothetic to each other. Therefore, the difference between the shape of p body 21 actually formed and the design shape of p body 21 which should be a homothetic shape to $n^+$ source region 22 can be made small. MOSFET 1 above is therefore a MOSFET having a stable reverse breakdown voltage.

Moreover, in MOSFET 1 above in which a circular shape is employed as the plane shape of a cell, a channel length (thickness of p body 21 surrounding n⁺ source region 22 in FIG. 2) is substantially the same in all directions. Accordingly, formation of an ineffective channel region which occurs such as when a conventional hexagonal cell is employed is suppressed, thereby substantially increasing a channel width. As a result, resistance per unit area during forward bias, i.e., on-resistance, is reduced.

As described above, MOSFET 1 is a semiconductor device achieving a stable reverse breakdown voltage and reduced on-resistance.

(Second Embodiment)

Figure 15:
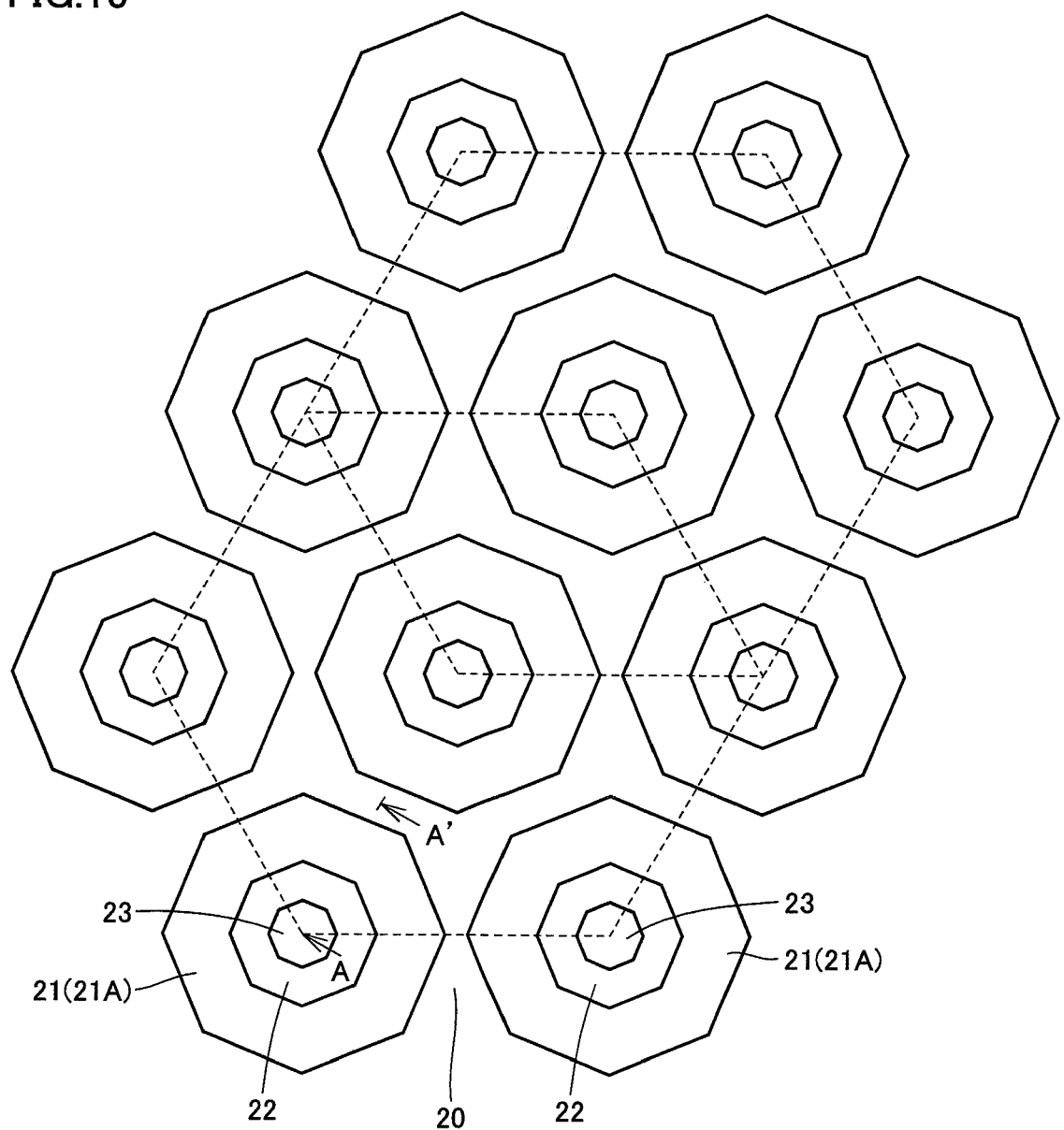
FIG. 15 is a schematic plan view showing the cell structure of the MOSFET according to a second embodiment.

Referring now to FIG. 15, a second embodiment which is another embodiment of the present invention is described. FIG. 15 is a plan view of first main surface 20A in FIG. 1 viewed from above, and corresponds to FIG. 2 described in the first embodiment.

MOSFET 1 as a semiconductor device in the second embodiment basically has a similar structure to MOSFET 1 in the first embodiment above, can be manufactured in a similar manner, and has a similar effect. MOSFET 1 in the second embodiment is different from the first embodiment, however, in terms of the plane shapes of p body 21, n⁺ source region 22 and p⁺ region 23, i.e., the plane shape of a cell.

Namely, referring to FIG. 15, p body 21 has a regular octagonal shape when viewed two-dimensionally in MOSFET 1 of the second embodiment. In addition, n⁺ source region 22 and p⁺ region 23 are arranged such that their centroids coincide with the centroid of p body 21 and have a homothetic shape to p body 21 when viewed two-dimensionally.

In MOSFET 1 of the second embodiment, since a regular octagonal shape is employed as the plane shape of a cell, the plane shapes of p body 21 and n⁺ source region 22 are regular octagonal shapes with coinciding centroids. This leads to a larger angle formed by the sides than when a conventional hexagonal cell is employed. Accordingly, even if the self-align process is employed to form p body 21 as in the first embodiment, for example, the shape of the opening of the mask in forming p body 21 and the shape of the opening of the mask in forming n⁺ source region 22 can be readily maintained to be substantially homothetic to each other. Therefore, the difference between the shape of p body 21 actually formed and the design shape of p body 21 which should be a homothetic shape to n⁺ source region 22 can be made small. MOSFET 1 in the second embodiment is therefore a MOSFET having a stable reverse breakdown voltage.

Moreover, in MOSFET 1 above in which a regular octagonal shape, i.e., a more circular shape than the conventional shape is employed as the plane shape of a cell, variation in channel length depending on a direction becomes smaller. Accordingly, formation of an ineffective channel region which occurs such as when a conventional hexagonal cell is employed is suppressed, thereby substantially increasing the channel width. As a result, resistance per unit area during forward bias, i.e., on-resistance, is reduced.

As described above, MOSFET 1 in the second embodiment is a semiconductor device achieving a stable reverse breakdown voltage and reduced on-resistance.

(Third Embodiment)

Figure 16:
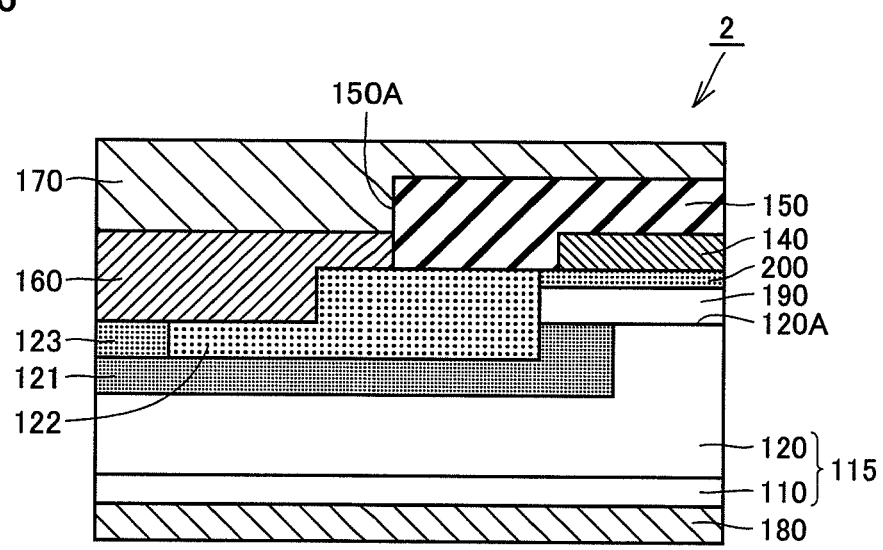
FIG. 16 is a schematic cross-sectional view showing a structure of a JFET.
Figure 17:
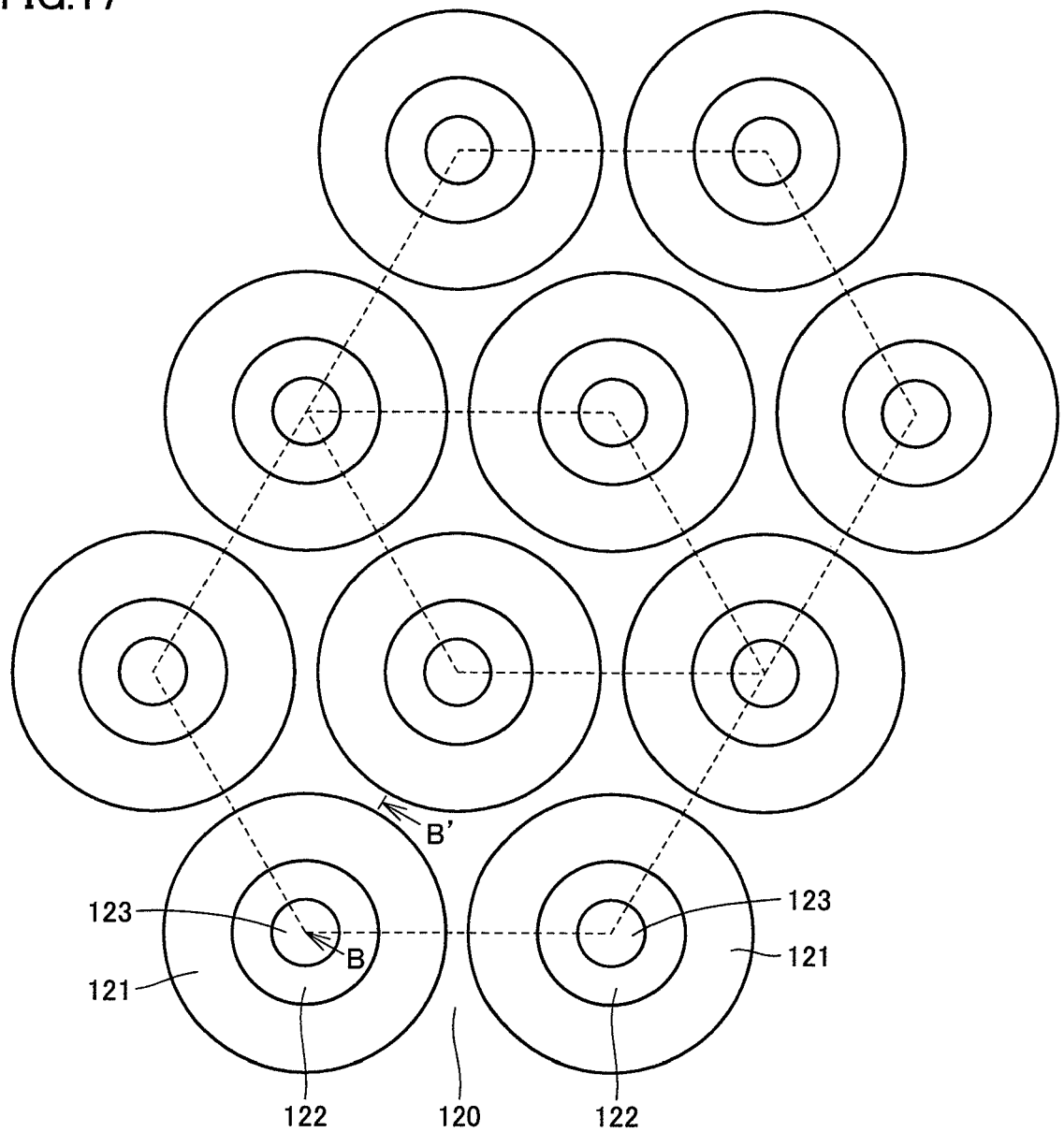
FIG. 17 is a schematic plan view showing a cell structure of the JFET.

Referring now to FIGS. 16 and 17, a third embodiment which is yet another embodiment of the present invention is described. FIG. 16 is a cross-sectional view taken along line B-B' in FIG. 17. FIG. 17 is a cross-sectional view of a JFET 2 viewed from above, which has been cut on a plane including a first main surface 120A in FIG. 16.

JFET 2 as a semiconductor device in the third embodiment has a similar structure to that in the first embodiment in terms of the plane shape and arrangement of a cell, and has a similar effect. Impurities introduced to the respective regions, electrodes and the like can also include elements similar to those in the first embodiment.

Specifically, JFET 2 in the third embodiment includes an n⁺ SiC substrate 110 made of SiC as a substrate of the n conductivity type, an n⁻ SiC layer 120 as a semiconductor layer of the n conductivity type, a p body 121 as a body region of the p conductivity type, a channel layer 190 of the n conductivity type, a gate region 200 of the p conductivity type, an n⁺ source region 122 as a carrier supply region of the n conductivity type, and a p⁺ region 123 as a high concentration second conductivity type region of the p conductivity type. N⁺ SiC substrate 110 and n⁻ SiC layer 120 form a SiC wafer 115 which is a semiconductor wafer of the n conductivity type. N⁺ SiC substrate 110, n⁻ SiC layer 120, and p body 121 correspond to n⁺ SiC substrate 10, n SiC layer 20, and p body 21 in the first embodiment, respectively, and have a similar structure. Referring to FIG. 17, a plurality of p bodies 121 are formed, each of which has a circular shape when viewed two-dimensionally. In addition, each of p bodies 121 is arranged to be positioned at a vertex of a regular hexagon when viewed two-dimensionally.

Channel layer 190 is formed on first main surface 120A of n⁻ SiC layer 120 opposite to a main surface on which n⁺ SiC substrate 110 is formed, and extends from a surface of a region where p body 121 is formed to a surface of a region where p body 121 is not formed. Gate region 200 is disposed in contact with channel layer 190 to extend over channel layer 190.

N⁺ source region 122 has an outer peripheral surface having a thickness in contact with p body 121, channel layer 190, and gate region 200, is arranged concentrically with p body 121 and has a circular shape when viewed two-dimensionally, and each of n⁺ source regions 122 is arranged to be positioned at a vertex of a regular hexagon in a manner similar to p body 121.

P⁺ region 123 is formed to be surrounded by n⁺ source region 122, is arranged concentrically with n⁺ source region 122 and has a circular shape when viewed two-dimensionally, and each of p⁺ regions 123 is arranged to be positioned at a vertex of a regular hexagon in a manner similar to p body 121 and n⁺ source region 122.

Referring to FIG. 16, JFET 2 further includes a gate electrode 140, an interlayer insulating film 150, a source ohmic electrode 160, a source line 170, and a drain ohmic electrode 180.

Gate electrode 140 is formed in contact with gate region 200 to extend from a region facing p body 121 with gate region 200 and channel layer 190 interposed therebetween to a region not facing p body 121.

Source ohmic electrode 160 is formed in contact with n⁺ source region 122 and p⁺ region 123. Source line 170 is formed on and in contact with source ohmic electrode 160. Drain ohmic electrode 180 is formed in contact with a main surface of n⁺ SiC substrate 110 opposite to a main surface on which n⁻ SiC layer 120 is formed.

Interlayer insulating film 150 is disposed between source ohmic electrode 160, source line 170 and gate electrode 140 to surround gate electrode 140. Thus, gate electrode 140 and source line 170, source ohmic electrode 160 are isolated from each other.

That is, WET 2 as a semiconductor device in the third embodiment includes SiC wafer 115 of the n conductivity type, the plurality of p bodies 121 of the p conductivity type formed to include first main surface 120A of SiC wafer 115, and n⁺ source regions 122 of the n conductivity type formed in regions surrounded by the plurality of p bodies 121, respectively, when viewed two-dimensionally. P body 121 has a circular shape when viewed two-dimensionally, and n$^+$ source region 122 is arranged concentrically with p body 121 and has a circular shape when viewed two-dimensionally. Additionally, each of the plurality of p bodies 121 is arranged to be positioned at a vertex of a regular hexagon when viewed two-dimensionally.

Operation of JFET 2 is described next. There are normally-off type JFETs and normally-on type JFETs in terms of operation, and one of them can be selected by adjusting a thickness and impurity concentration of channel layer 190. Here, JFET 2 of normally-on type is described.

Referring to FIG. 16, when gate electrode 140 has a potential the same as that of source line 170, a region in channel layer 190 sandwiched between gate electrode 140 and p body 121 is not completely depleted, so that source line 170 and drain ohmic electrode 180 are electrically connected to each other via source ohmic electrode 160, n$^+$ source region 122, channel layer 190, n$^-$ SiC layer 120, and n$^+$ SiC substrate 110. Accordingly, application of a voltage across source line 170 and drain ohmic electrode 180 causes a current to flow between source line 170 and drain ohmic electrode 180.

As the potential of gate electrode 140 is lowered with respect to that of source line 170, depletion of the region in channel layer 190 sandwiched between gate electrode 140 and p body 121 progresses, causing electrical cutoff between n$^+$ source region 122 and n$^-$ SiC layer 120. Accordingly, application of a voltage across source line 170 and drain ohmic electrode 180 does not cause a current flow.

Referring now to FIGS. 16 to 28, a method of manufacturing JFET 2 in the third embodiment is described. FIGS. 18 to 28 are cross-sectional views corresponding to the cross section in FIG. 16.

Figure 18:
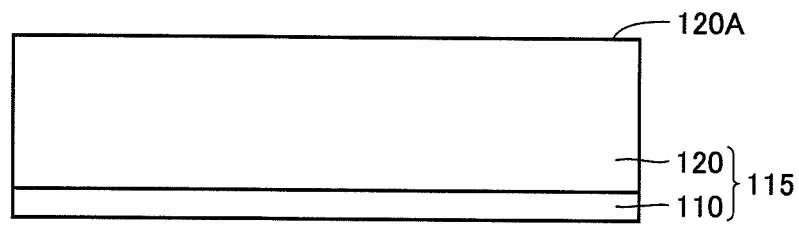
FIG. 18 is a schematic cross-sectional view for illustrating a manufacturing step of the JFET.

In the method of manufacturing WET 2 of the present embodiment, first, a step of preparing n$^+$ SiC substrate 110 and a step of forming n$^-$ SiC layer 120 are performed. These steps can be performed in a manner similar to the first embodiment. Consequently, SiC wafer 115 having n$^-$ SiC layer 120 formed on n$^+$ SiC substrate 110 is completed as shown in FIG. 18.

Figure 19:
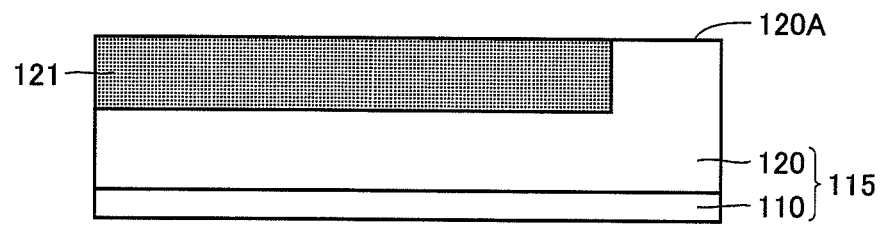
FIG. 19 is a schematic cross-sectional view for illustrating a manufacturing step of the JFET.
Figure 20:
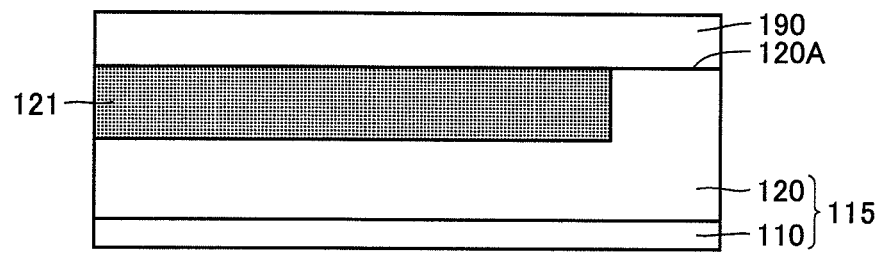
FIG. 20 is a schematic cross-sectional view for illustrating a manufacturing step of the WET.
Figure 21:
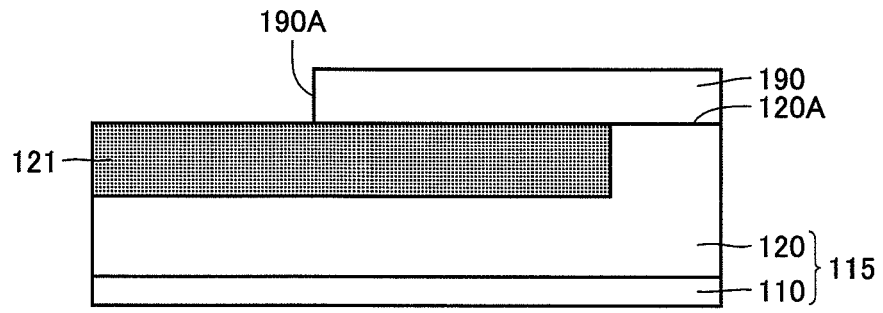
FIG. 21 is a schematic cross-sectional view for illustrating a manufacturing step of the NET.
Figure 22:
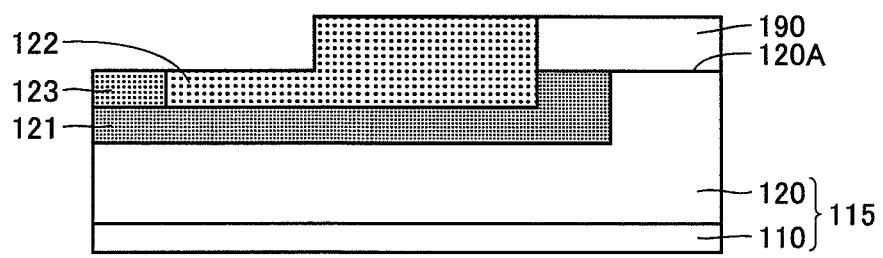
FIG. 22 is a schematic cross-sectional view for illustrating a manufacturing step of the WET.
Figure 23:
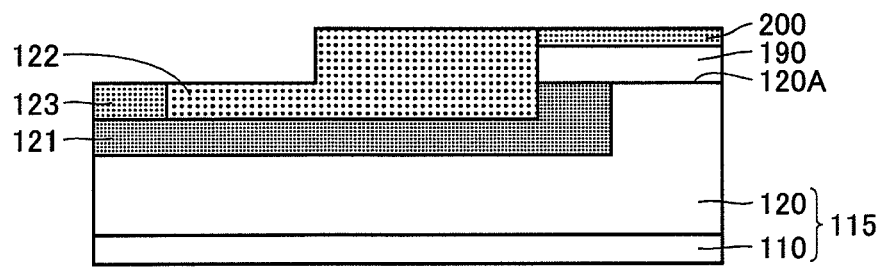
FIG. 23 is a schematic cross-sectional view for illustrating a manufacturing step of the WET.
Figure 24:
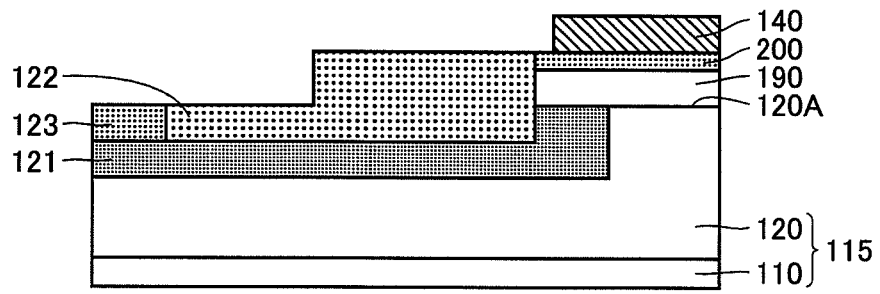
FIG. 24 is a schematic cross-sectional view for illustrating a manufacturing step of the WET.

Next, a step of forming p body 121 is performed. In this step, first, a mask layer formed of an oxide film having an, opening corresponding to a shape of desired p body 121 is formed. Then, ions are implanted with this mask layer as a mask, to form p body 121 having a circular plane shape as shown in FIG. 19.

Next, a step of forming channel layer 190 is performed. Specifically, referring to FIG. 20, channel layer 190 including an n type impurity is formed on first main surface 120A by epitaxial growth, for example.

Next, a step of forming n$^+$ source region 122 and a step of forming p$^+$ region 123 are performed. Specifically, referring to FIGS. 20 and 21, first, channel layer 190 is partially removed by etching. Consequently, a central portion of p body 121 having a circular shape is exposed through channel layer 190. Next, referring to FIGS. 21 and 22, mask layers having openings corresponding to n$^+$ source region 122 and p$^+$ region 123 are formed, respectively, and ions are implanted sequentially in a manner similar to the formation of p body 121, to form n$^+$ source region 122 and p$^+$ region 123.

Next, a step of forming gate region 200 is performed. In this step, referring to FIG. 23, a mask layer is formed which has an opening corresponding to remaining channel layer 190 into which the ions were not implanted in the above steps of forming n$^+$ source region 122 and p$^+$ region 123, and ions are implanted with this mask layer as a mask. Consequently, gate region 200 into which a p type impurity was introduced is formed.

Next, an activation annealing step is performed. In this step, the region into which the ions were implanted in the above process is heated, to activate the introduced impurity.

Next, a step of forming gate electrode 40 is performed. In this step, referring to FIGS. 23 and 24, a resist film having an opening corresponding to a shape of desired gate electrode 140 is formed, and then a polysilicon film is formed by CVD, for example. The polysilicon film on the resist film is then removed along with the resist film, to form gate electrode 140.

Figure 25:
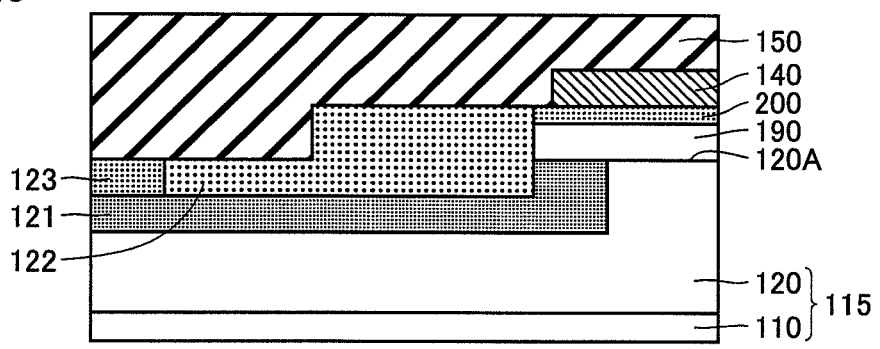
FIG. 25 is a schematic cross-sectional view for illustrating a manufacturing step of the WET.
Figure 26:
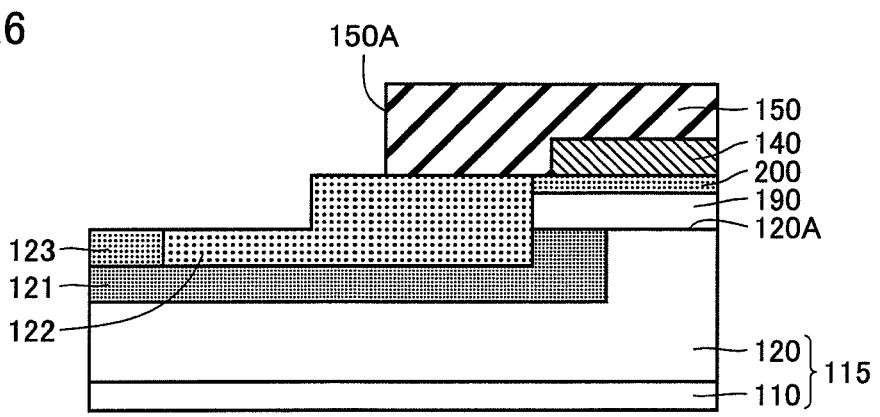
FIG. 26 is a schematic cross-sectional view for illustrating a manufacturing step of the JFET.

Next, a step of forming interlayer insulating film 150 is performed. In this step, first, interlayer insulating film 150 formed of a SiO$_2$ film, for example, is formed to entirely cover a region over first main surface 120A as shown in FIG. 25. Then, after a resist film having an opening in a desired region is formed, RIE is performed with this resist film as a mask, to form a through hole in interlayer insulating film 150. Consequently, as shown in FIG. 26, a contact hole 150A passing through interlayer insulating film 150 in a thickness direction to expose p$^+$ region 123 and n$^+$ source region 122 is formed. With this process, interlayer insulating film 150 surrounding gate electrode 140 is completed.

Figure 27:
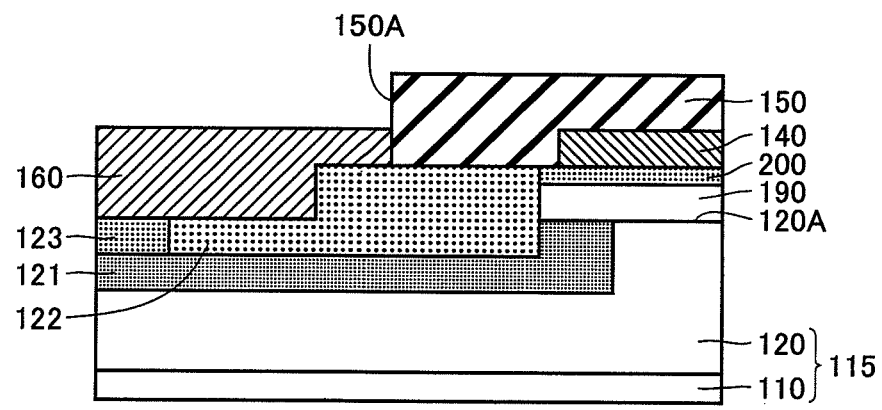
FIG. 27 is a schematic cross-sectional view for illustrating a manufacturing step of the WET.
Figure 28:
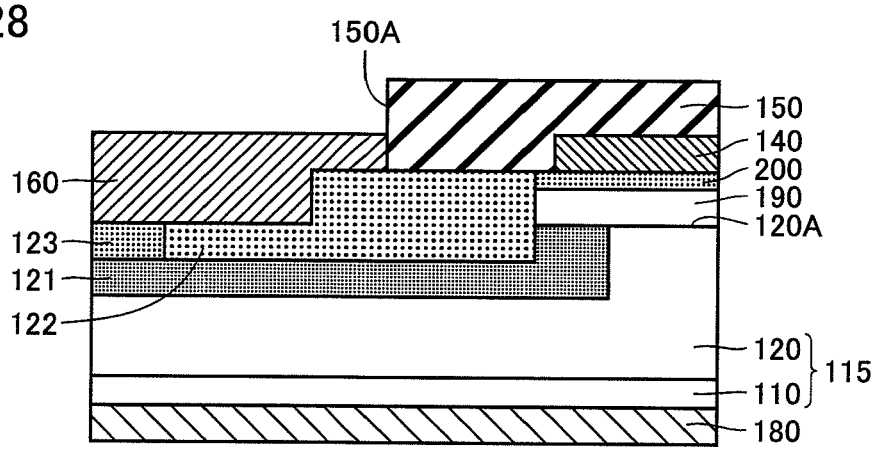
FIG. 28 is a schematic cross-sectional view for illustrating a manufacturing step of the JFET.

Next, a step of forming source ohmic electrode 160 and drain ohmic electrode 180 is performed. Specifically, first, a Ni film is formed on first main surface 120A, with the resist film that was used for forming contact hole 150A being left. Then, the Ni film on the resist film is removed along with the resist film, to leave the Ni film in contact with p$^+$ region 123 and n$^+$ source region 122 exposed through contact hole 150A formed in interlayer insulating film 150. This Ni film is then heated and silicidized, to complete source ohmic electrode 160 made of NiSi as shown in FIG. 27. Further, a Ni film is formed on the main surface of n$^+$ SiC substrate 110 opposite to the main surface on which n$^-$ SiC layer 120 is formed, and this Ni film is silicidized, to form drain ohmic electrode 180 made of NiSi as shown in FIG. 28. To simplify the manufacturing process, source ohmic electrode 160 and drain ohmic electrode 180 can be formed simultaneously.

Next, a step of forming source line 170 is performed. In this step, referring to FIGS. 28 and 16, an Al film is formed in contact with a surface of source ohmic electrode 160, for example, to form source line 170. With the process described above, JFET 2 in the third embodiment is completed.

In JFET 2 of the present embodiment, a circular shape is employed as the plane shape of a cell in a manner similar to MOSFET 1 in the first embodiment. Accordingly, JFET 2 is a semiconductor device achieving a stable reverse breakdown voltage and reduced on-resistance.

While a circular shape is employed as the plane shape of a cell in the third embodiment above, the circular shape may be replaced with a regular polygonal shape with seven or more vertices such as a regular octagonal shape as in the second embodiment, or a polygonal shape with even more vertices such as a regular polygonal shape with twenty or more vertices.

Further, while a MOSFET and a JFET are described as examples of the semiconductor device according to the present invention in the embodiments above, the semiconductor device according to the present invention is not limited as such, but may be an IGBT, for example. Furthermore, while a substrate and a semiconductor layer are made of SiC in the semiconductor device according to the present invention in the embodiments above, the semiconductor device according to the present invention is not limited as such. As a material for the substrate and the semiconductor layer of the semiconductor device according to the present invention, Si may be employed, or a wide band gap semiconductor such as GaN (gallium nitride) may be employed.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

The semiconductor device according to the present invention is advantageously applicable particularly to a semiconductor device required to have a stable reverse breakdown voltage and reduced on-resistance.

DESCRIPTION OF THE REFERENCE SIGNS

1 MOSFET; 2 JFET; 10, 110 n$^+$ SiC substrate; 15, 115 SiC wafer; 20, 120 SiC layer; 20A, 120A first main surface; 21, 121 p body; 21A channel region; 22, 122 n$^+$ source region; 23 123 p$^+$ region; 30 gate oxide film; 40, 140 gate electrode; 50, 150 interlayer insulating film; 50A, 150A contact hole; 60, 160 source ohmic electrode; 70, 170 source line; 80, 180 drain ohmic electrode; 190 channel layer; 200 gate region.

The invention claimed is:

1. A semiconductor device comprising:
a semiconductor wafer of a first conductivity type;
a plurality of body regions of a second conductivity type formed to include a first main surface which is one main surface of said semiconductor wafer; and
carrier supply regions of the first conductivity type formed in regions surrounded by said plurality of body regions, respectively, when viewed two-dimensionally,
each of said body regions having an outer periphery located outside of said carrier supply regions, said outer periphery having a substantially circular shape when viewed two-dimensionally,
each of said carrier supply regions being arranged concentrically with each of said body regions and having a substantially circular shape when viewed two-dimensionally, and
each of said plurality of body regions being arranged to be positioned at a vertex of a regular hexagon when viewed two-dimensionally,
wherein said semiconductor wafer includes a semiconductor substrate of the first conductivity type and a semiconductor layer of the first conductivity type, said semiconductor layer is formed between said semiconductor substrate and said plurality of body regions,
wherein a concentration of the first conductivity type impurity contained in said semiconductor layer is lower than that of said semiconductor substrate, and
wherein a concentration of the first conductivity type impurity contained in said semiconductor substrate is greater than a concentration of the second conductivity type impurity contained in said plurality of body regions.

2. The semiconductor device according to claim 1, wherein said semiconductor wafer is made of a wide band gap semiconductor.

3. The semiconductor device according to claim 1, wherein said semiconductor wafer is made of silicon carbide.

4. The semiconductor device according to claim 1, wherein said semiconductor wafer is made of gallium nitride.

* * * * *